United States Patent
Zen et al.

(10) Patent No.: US 12,073,780 B2
(45) Date of Patent: Aug. 27, 2024

(54) SIGNAL PROCESSING DEVICE, SIGNAL PROCESSING METHOD, AND DISPLAY DEVICE

(71) Applicant: SATURN LICENSING LLC, New York, NY (US)

(72) Inventors: Masao Zen, Tokyo (JP); Kazuhiro Nukiyama, Tokyo (JP); Syunsuke Kikuchi, Tokyo (JP)

(73) Assignee: SATURN LICENSING LLC, New York, NY (US)

( * ) Notice: Subject to any disclaimer, the term of this patent is extended or adjusted under 35 U.S.C. 154(b) by 0 days.

(21) Appl. No.: 17/757,768

(22) PCT Filed: Dec. 14, 2020

(86) PCT No.: PCT/JP2020/046460
§ 371 (c)(1),
(2) Date: Jun. 20, 2022

(87) PCT Pub. No.: WO2021/131830
PCT Pub. Date: Jul. 1, 2021

(65) Prior Publication Data
US 2023/0018404 A1   Jan. 19, 2023

(30) Foreign Application Priority Data
Dec. 27, 2019   (JP) .................. 2019-238105

(51) Int. Cl.
*G09G 3/3208*   (2016.01)

(52) U.S. Cl.
CPC ... *G09G 3/3208* (2013.01); *G09G 2320/0261* (2013.01); *G09G 2360/147* (2013.01); *G09G 2360/16* (2013.01)

(58) Field of Classification Search
CPC ......... G09G 3/3208; G09G 2320/0261; G09G 2360/147; G09G 2360/16
See application file for complete search history.

(56) References Cited

U.S. PATENT DOCUMENTS

| | | | |
|---|---|---|---|
| 9,589,511 B2 * | 3/2017 | Huang | G09G 3/3406 |
| 2008/0180385 A1 * | 7/2008 | Yoshida | G09G 3/2074 345/87 |

(Continued)

FOREIGN PATENT DOCUMENTS

| | | |
|---|---|---|
| CN | 109360530 A | 2/2019 |
| JP | 2004-252216 A | 9/2004 |

(Continued)

OTHER PUBLICATIONS

International Search Report and Written Opinion of PCT Application No. PCT/JP2020/046460, issued on Mar. 2, 2021, 11 pages of ISRWO.

*Primary Examiner* — Amare Mengistu
*Assistant Examiner* — Jennifer L Zubajlo
(74) *Attorney, Agent, or Firm* — Richard LaPeruta

(57) ABSTRACT

The present technology relates to a signal processing device, a signal processing method, and a display device for enabling more appropriate improvement of hold blur. There is provided a signal processing device including a detection unit that analyzes a video signal of content and detects an index that correlates with hold blur, a first calculation unit that calculates a light emission duty value of a self-luminous display panel on the basis of the detected index, and a second calculation unit that calculates a gain for luminance compensation on the basis of the calculated light emission duty value. The present technology can be applied to, for example, a self-luminous display device.

20 Claims, 14 Drawing Sheets

(56) References Cited

U.S. PATENT DOCUMENTS

| | | | | |
|---|---|---|---|---|
| 2009/0135304 A1* | 5/2009 | Inoue | ............... | G09G 5/006 |
| | | | | 348/712 |
| 2010/0002148 A1* | 1/2010 | Otawara | ............... | G09G 3/3258 |
| | | | | 348/739 |
| 2010/0171770 A1* | 7/2010 | Inoue | ............... | G09G 3/3233 |
| | | | | 345/77 |
| 2016/0093248 A1* | 3/2016 | Shimizu | ............... | G09G 3/3225 |
| | | | | 345/691 |
| 2016/0155382 A1* | 6/2016 | Cheon | ............... | G09G 3/3258 |
| | | | | 345/76 |
| 2019/0130851 A1* | 5/2019 | Cui | ............... | G09G 3/3406 |
| 2020/0233264 A1 | 7/2020 | Zuo | | |
| 2021/0074226 A1* | 3/2021 | Ikeyama | ............... | G09G 3/3426 |
| 2022/0130341 A1 | 4/2022 | Ikeyama | | |

FOREIGN PATENT DOCUMENTS

| | | | | | |
|---|---|---|---|---|---|
| JP | 2006-189658 | A | | 7/2006 | |
| JP | 2008-139797 | A | | 6/2008 | |
| JP | 2010-160237 | A | | 7/2010 | |
| JP | 2010160237 | A | * | 7/2010 | |
| JP | 2018-151666 | A | | 9/2018 | |
| WO | 2008/153055 | A1 | | 12/2008 | |
| WO | 2019/124254 | A1 | | 6/2019 | |
| WO | WO-2019124254 | A1 | * | 6/2019 | ............ G09G 3/2014 |

\* cited by examiner

| LIGHT EMISSION DUTY | GAIN | MOVING IMAGE DISPLAY PERFORMANCE | SELF-LUMINOUS ELEMENT STRESS |
|---|---|---|---|
| 100% | ×1 | LOW | SMALL |
| 50% | ×2 | HIGH | LARGE |

SIGNAL PROCESSING DEVICE, SIGNAL PROCESSING METHOD, AND DISPLAY DEVICE

CROSS REFERENCE TO RELATED APPLICATIONS

This application is a U.S. National Phase of International Patent Application No. PCT/JP2020/046460 filed on Dec. 14, 2020, which claims priority benefit of Japanese Patent Application No. JP 2019-238105 filed in the Japan Patent Office on Dec. 27, 2019. Each of the above-referenced applications is hereby incorporated herein by reference in its entirety.

TECHNICAL FIELD

The present technology relates to a signal processing device, a signal processing method, and a display device, and more particularly to a signal processing device, a signal processing method, and a display device for enabling more appropriate improvement of hold blur.

BACKGROUND ART

In recent years, OLED display devices, which are becoming mainstream as display devices for displaying videos, are hold-type display devices. It has been reported that hold blur occurs in this type of display devices due to human visual characteristics.

Various proposals have been made as methods for improving this type of hold blur. For example, a liquid crystal display device has been proposed that improves hold blur by controlling drive of a backlight provided on a liquid crystal display panel according to a motion of an object included in a video content (see Patent Document 1).

CITATION LIST

Patent Document

Patent Document 1: International Publication No. 2019/124254

SUMMARY OF THE INVENTION

Problems to be Solved by the Invention

By the way, even a self-luminous display device such as an OLED display device is required to improve the hold blur, but at present, such a technical method has not been established.

The present technology has been made in view of such a situation, and enables more appropriate improvement of hold blur.

Solutions to Problems

A signal processing device according to one aspect of the present technology is a signal processing device including: a detection unit configured to analyze a video signal of content and detect an index that correlates with hold blur; a first calculation unit configured to calculate a light emission duty value of a self-luminous display panel on the basis of the detected index; and a second calculation unit configured to calculate a gain for luminance compensation on the basis of the calculated light emission duty value.

A signal processing method according to one aspect of the present technology is a signal processing method including: by a signal processing device, analyzing a video signal of content and detecting an index that correlates with hold blur; calculating a light emission duty value of a self-luminous display panel on the basis of the detected index; and calculating a gain for luminance compensation on the basis of the calculated light emission duty value.

A display device according to one aspect of the present technology is a display device including: a signal processing unit configured to process a video signal of content; a self-luminous display panel configured to display a video of the content; and a display panel drive unit configured to drive the self-luminous display panel on the basis of the video signal from the signal processing unit, in which the signal processing unit includes a detection unit configured to analyze the video signal of content and detect an index that correlates with hold blur, a first calculation unit configured to calculate a light emission duty value of the self-luminous display panel on the basis of the detected index, and a second calculation unit configured to calculate a gain for luminance compensation on the basis of the calculated light emission duty value, and the display panel drive unit drives the self-luminous display panel on the basis of the light emission duty value and the gain calculated by the signal processing unit.

In the signal processing device, the signal processing method, and the display device according to one aspect of the present technology, a video signal of content is analyzed and an index that correlates with hold blur is detected, a light emission duty value of a self-luminous display panel is calculated on the basis of the detected index, and a gain for luminance compensation is calculated on the basis of the calculated light emission duty value.

Note that the signal processing device or the display device according to one aspect of the present technology may be an independent device or may be internal blocks constituting one device.

MODE FOR CARRYING OUT THE INVENTION

1. Embodiment of Present Technology

Configuration of Signal Processing Device

Figure 1:
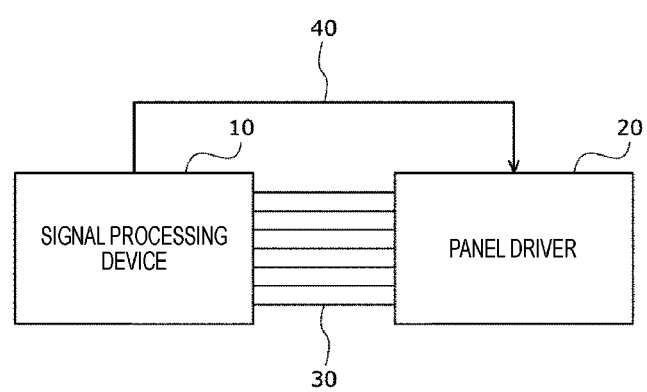
FIG. 1 is a block diagram illustrating an example of a configuration of an embodiment of a signal processing device to which the present technology is applied.

FIG. 1 is a diagram illustrating an example of a configuration of an embodiment of a signal processing device to which the present technology is applied.

FIG. 1 illustrates a signal processing device 10 that processes an input signal input from a signal input unit (not illustrated) provided in a front stage and a panel driver 20 that drives an OLED display panel (not illustrated) provided in a rear stage. The signal processing device 10 and the panel driver 20 are connected by a plurality of signal lines 30 and a control line 40.

The signal processing device 10 outputs a video signal to the panel driver 20 via the signal lines 30. Furthermore, the signal processing device 10 outputs a control signal to the panel driver 20 via the control line 40.

The signal processing device 10 performs predetermined signal processing on the basis of the input signal input thereto. In this signal processing, a video signal for controlling drive of the OLED display panel is generated and supplied to the panel driver 20.

The panel driver 20 drives the OLED display panel in the rear stage on the basis of the video signal supplied from the signal processing device 10.

The OLED display panel is a display panel in which pixels including OLED elements are arranged in a two-dimensional shape (matrix shape), and displays a video according to the drive from the panel driver 20. The OLED display panel is an example of a self-luminous display panel using an OLED element as a self-luminous element. Note that details of a self-luminous display device having the self-luminous display panel will be described below with reference to FIG. 16.

An organic light emitting diode (OLED) is a light emitting element having a structure in which an organic light emitting material is sandwiched between a cathode and an anode, and constitutes pixels (display pixels) arranged in a two-dimensional manner on an OLED display panel. The OLED element included in the pixel is driven according to a drive control signal generated by the signal processing. In the OLED display panel, each pixel (display pixel) includes, for example, four sub-pixels of red (R), green (G), blue (B), and white (W).

Figure 2:
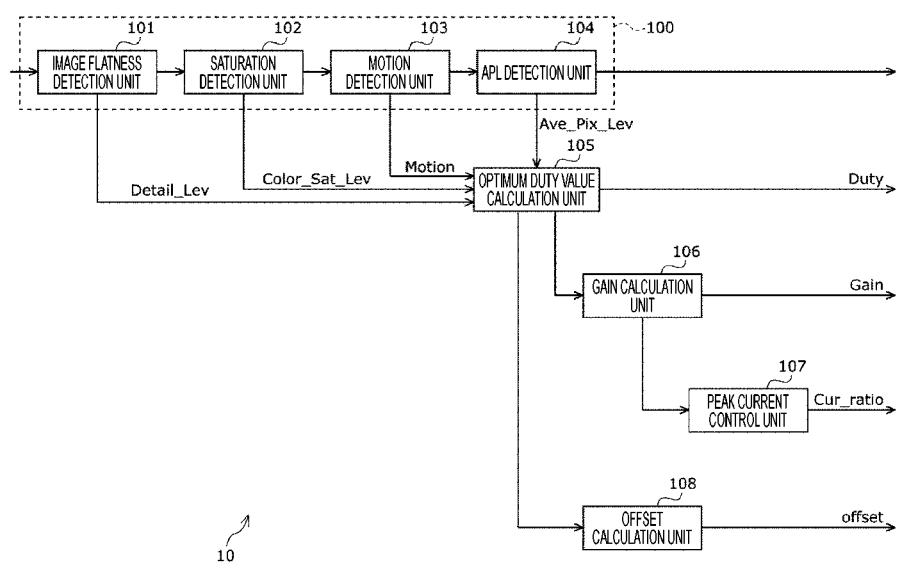
FIG. 2 is a block diagram illustrating an example of a detailed configuration of the signal processing device of FIG. 1.

FIG. 2 illustrates a detailed configuration of the signal processing device 10 of FIG. 1.

In FIG. 2, the signal processing device 10 includes an image flatness detection unit 101, a saturation detection unit 102, a motion detection unit 103, an APL detection unit 104, an optimum duty value calculation unit 105, a gain calculation unit 106, and a peak current control unit 107, and an offset calculation unit 108.

The image flatness detection unit 101 performs image flatness detection processing for the video signal input therein, and supplies a detail level (Detail_Lev) obtained as a result of the processing to the optimum duty value calculation unit 105.

For example, hold blur occurs in an image frame including fine parts including many edges and does not occur in a flat part. Therefore, in the image flatness detection processing, the detail level is detected as an index representing an edge part included in the video signal by analyzing spatial resolution of a plurality of image frames constituting a video. As a method for detecting the detail level, for example, a bandpass filter that passes only a specific frequency can be used for detection.

The saturation detection unit 102 performs saturation detection processing for the video signal input therein, and supplies a saturation level (Color_Sat_Lev) obtained as a result of the processing to the optimum duty value calculation unit 105.

For example, in the saturation detection processing, the saturation level is detected as an index representing characteristics related to vividness of the video by analyzing a color signal or the like obtained from the video signal.

The motion detection unit 103 performs motion detection processing for the video signal input therein, and supplies a motion amount (Motion) obtained as a result of the processing to the optimum duty value calculation unit 105.

For example, the hold blur does not occur unless an object (displayed object) displayed as a video is moving. Therefore, in the motion detection processing, the motion amount is detected as an index representing a motion of the displayed object in the video. As a method for detecting the motion amount, for example, a difference in luminance of each pixel between image frames or a motion vector amount of the displayed object can be used for detection.

The APL detection unit 104 performs APL detection processing for the video signal input therein, and supplies an average pixel level (Ave_Pix_Lev) obtained as a result of the processing to the optimum duty value calculation unit 105.

For example, in the APL detection processing, the average pixel level is detected as an index representing characteristics related to the video by obtaining an average value of pixel levels of the image frames constituting the video.

In this way, the image flatness detection unit 101, the saturation detection unit 102, the motion detection unit 103, and the APL detection unit 104 constitutes a detection unit 100 that analyzes the video signal of content and detects various parameters as the indexes correlating with the hold blur. Then, at least one of the four parameters (Detail_Lev, Color_Sat_Lev, Motion, and Ave_Pix_Lev) detected by the detection unit 100 is supplied to the optimum duty value calculation unit 105.

Note that the video signal processed by the detection unit 100 is output to the panel driver 20 via the signal lines 30.

The optimum duty value calculation unit 105 calculates an optimum light emission duty value (Duty) on the basis of the parameters supplied from the detection unit 100, and supplies the optimum duty value to the panel driver 20 (FIG. 1), the gain calculation unit 106, or the offset calculation unit 108. This light emission duty value is a light emission duty ratio of the OLED element arranged on the OLED display panel, and is also hereinafter referred to as light emission duty.

The gain calculation unit 106 calculates a gain for luminance compensation on the basis of the light emission duty value supplied from the optimum duty value calculation unit 105, and supplies the gain to the panel driver 20 or the peak current control unit 107.

The peak current control unit 107 calculates a current limit value (Cur_ratio) on the basis of the gain supplied from the gain calculation unit 106, and supplies the current limit value (Cur_ratio) to the panel driver 20.

The offset calculation unit 108 calculates an offset value (offset) related to the luminance of the video signal on the basis of the light emission duty value supplied from the optimum duty value calculation unit 105, and supplies the offset value to the panel driver 20.

To the panel driver 20, the control signal including at least one of the four parameters: light emission duty value (Duty), gain (Gain), current limit value (Cur_ratio), and offset value (offset) is input from the signal processing device 10 via the control line 40. The panel driver 20 drives the OLED display panel in the rear stage on the basis of the parameters included in the control signal.

The signal processing device 10 is configured as described above.

Example of Black Insertion Drive

By the way, a self-luminous display device such as an OLED display device is a hold-type display device similar to a non-self-luminous display device such as a liquid crystal display device. In the hold-type display device, in principle, pixels two-dimensionally arranged on a display unit perform display with the same luminance (hold-type display) during one frame. Therefore, it is known that hold blur occurs in this type of display device due to human visual characteristics.

For example, in the OLED display device, when user's eyes follow a moving displayed object in one frame in a case where light is continuously lit during the one frame period, the user feels the displayed object as a hold-type afterimage. If the light emission duty of the OLED element is reduced, the hold blur is improved, but to maintain the luminance, the gain needs to be raised by a reciprocal (1/Duty) of the light emission duty value.

Figure 3:
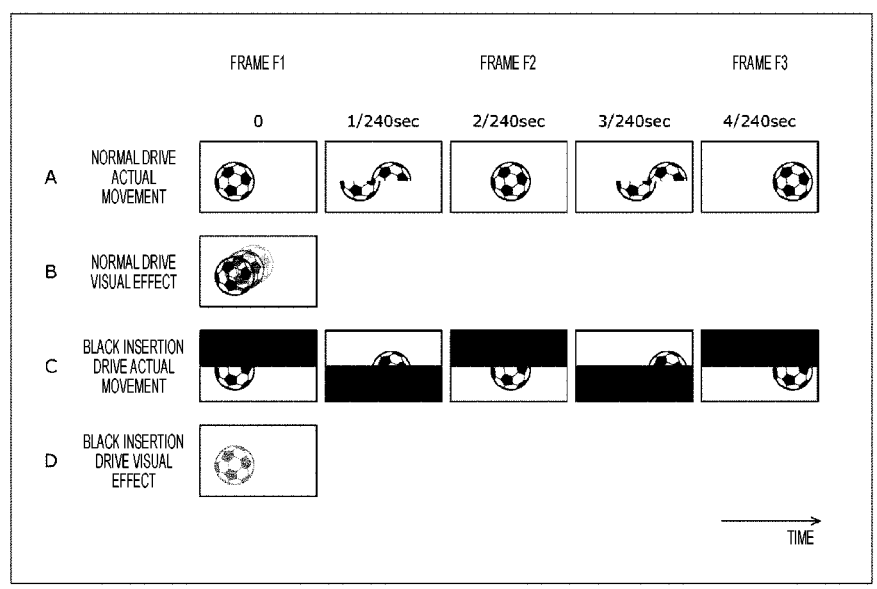
FIGS. 3A, 3B, 3C and 3D are diagrams illustrating an example of improvement of hold blur by black insertion drive.

FIGS. 3A, 3B, 3C and 3D illustrates an example of improvement of hold blur by black insertion drive. FIGS. 3A and 3B illustrate actual movements and visual effects during normal drive, and FIG. 3C and FIG. 3D illustrate actual movements and visual effects during black insertion drive In the normal drive, drive is performed with the light emission duty of 100% (Duty100%). On the other hand, in the black insertion drive, a display time of the video is shortened by providing a black display period during the display period for displaying the same video (image frame). By this black insertion drive, the moving image display performance can be improved. In the black insertion drive, the light emission duty can be changed in a range of Duty50% to Duty100%. In this example, the case where drive is performed with the light emission duty of 50% (Duty50%) will be described.

In FIGS. 3A, 3B, 3C and 3D, the direction of time goes from the left side to the right side, and image frames F1, F2, and F3 are displayed in order during 0,1/240 sec, 2/240 sec, 3/240 sec, and 4/240 sec.

In the case where the actual movement of the normal drive illustrated in FIG. 3A is performed, the user feels the hold-type afterimage when the eyes follow the moving displayed object (ball) in the image frame F, as illustrated in the normal drive visual effect in FIG. 3B.

On the other hand, in the case where the black insertion drive illustrated in FIG. 3C is performed, the hold blur can be improved as illustrated in the black insertion drive visual effect in FIG. 3D. However, in the case where the light emission duty is reduced, the luminance is lowered accordingly.

Figures 4, 5:
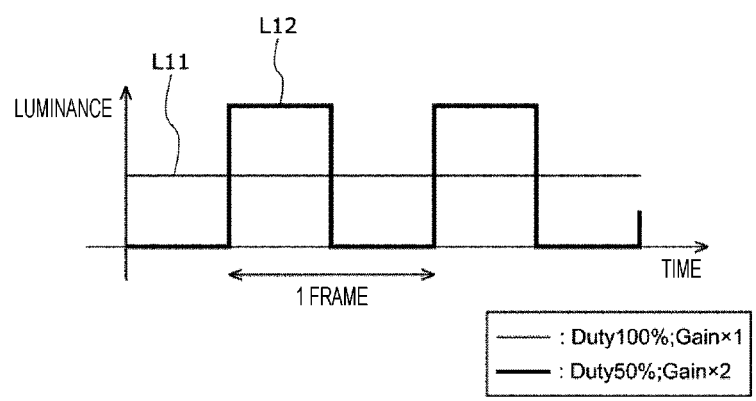
FIG. 4 is a graph illustrating an example of luminance compensation during black insertion drive.
FIG. 5 is a table illustrating an example of a relationship among light emission duty, a gain, moving image display performance, and self-luminous element stress.

FIG. 4 illustrates an example of luminance compensation during black insertion drive. In FIG. 4, the horizontal axis represents time and the vertical axis represents luminance level.

In FIG. 4, a waveform L11 illustrates a light emission waveform of the OLED element during normal drive. The light emission waveform of the normal drive represents a constant fixed luminance level, the light emission duty of 100% (Duty100%), and the gain of 1 time (Gain×1).

A waveform L12 illustrates a light emission waveform of the OLED element during black insertion drive. The light emission waveform of the black insertion drive is a rectangular wave, and represents the light emission duty of 50% (Duty50%) and the gain of double (Gain×2).

In this way, in the case where the duty becomes Duty50% during black insertion drive, the luminance compensation is performed by raising the gain to double the luminance at the time of light emission of the OLED element so that the average luminance becomes the same as Duty100%.

Control According to Motion and Edge

FIG. 5 illustrates an example of a relationship among the light emission duty, the gain, moving image display performance, and self-luminous element stress.

As illustrated in FIG. 5, the moving image display performance can be improved by doubling the gain when the light emission duty is reduced to 50% to keep the luminance constant, but the stress of the self-luminous element such as the OLED element increases. Therefore, in a still image, it is necessary to return the light emission duty to 100% to reduce the stress of the OLED element and suppress the decrease in the life of the OLED element.

For example, in a liquid crystal display device, to improve hold-type hold blur, a method of reducing a duty ratio for lighting a backlight such as a light emitting diode (LED) and raising the gain for luminance compensation is used in an image frame including a fast-moving displayed object.

On the other hand, in an image frame of a still image, the duty ratio is set to 100% and the gain is restored to minimize temperature rise and stress of the LED and the like, so that both the reliability and the moving image performance are achieved. Furthermore, in a fine video (a clear image frame having a high frequency component), a control for reducing the duty ratio is performed in order to enhance the effect of improving hold blur.

Since the OLED display device has the OLED element as the self-luminous element, the light emission duty is controlled by changing the configuration of the drive circuit inside a display cell and performing the black insertion drive, thereby enabling to improve the hold blur, which has been described above.

In the OLED display device, it is possible to apply a gain to compensate for luminance in order to suppress the decrease in luminance during black insertion drive, but if this drive is performed all the time, the stress on the OLED element increases and the life is shortened. Therefore, in the present technology, the light emission duty is controlled according to the parameters such as the motion amount indicating the motion of the displayed object and the detail level indicating the fineness of the video.

Specifically, in the signal processing device 10, the optimum duty value calculation unit 105 calculates an optimum light emission duty value using the motion amount detected by the motion detection unit 103, so that the hold blur can be improved for a moving image.

Figure 6:
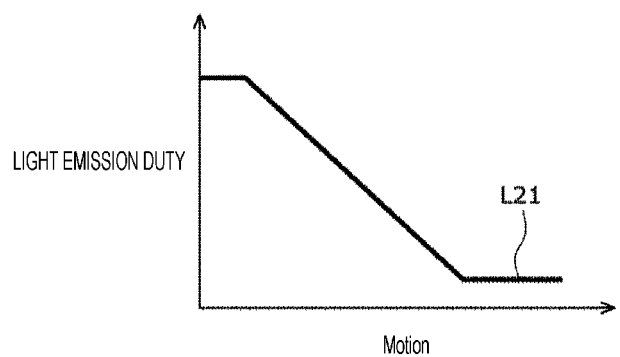
FIG. 6 is a graph illustrating an example of control of light emission duty according to a motion amount.

FIG. 6 illustrates an example of control of the light emission duty according to the motion amount. In FIG. 6, the horizontal axis represents the motion amount (Motion), and the vertical axis represents the light emission duty value.

FIG. 6 illustrates that the motion amount of the displayed object in the video increases as the value on the horizontal axis goes rightward, and the light emission duty value increases as the value on the vertical axis moves upward. Since the hold blur is easily visible in the video including the displayed object having a large motion amount, control is performed to reduce the light emission duty as illustrated by the polygonal line L21. On the other hand, in the video with a small motion amount such as a still image, control is performed to raise the light emission duty as illustrated by the polygonal line L21. That is, the light emission duty value is reduced as the detected motion amount increases.

Furthermore, in the signal processing device 10, the optimum duty value calculation unit 105 calculates the optimum light emission duty value using the detail level detected by the image flatness detection unit 101, so that the hold blur can be improved for a clear video having a high frequency component (image frame including edges).

Figure 7:
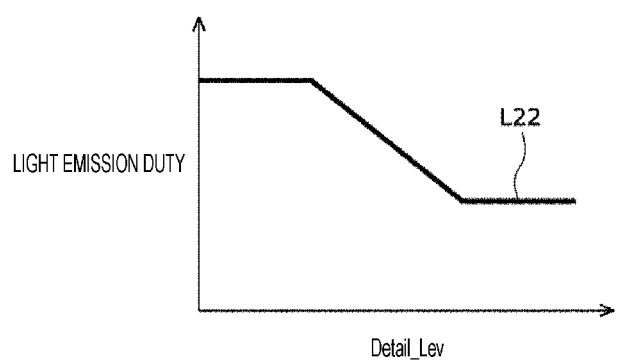
FIG. 7 is a graph illustrating an example of control of light emission duty according to a detail level.

FIG. 7 illustrates an example of control of the light emission duty according to the detail level. In FIG. 7, the horizontal axis represents the detail level (Detail_Lev), and the vertical axis represents the light emission duty value.

FIG. 7 illustrates that a video becomes finer and including more edge portions as the value on the horizontal axis goes rightward, and the light emission duty value becomes higher as the value on the vertical axis goes upward. Since the hold blur is easily visible in the fine image, control is performed to reduce the light emission duty as illustrated by the polygonal line L22. On the other hand, in a flat video, control is performed to raise the light emission duty as illustrated by the polygonal line L22. That is, the light emission duty value is reduced as the detected detail level increases.

By controlling the light emission duty in this way, the hold blur can be improved. Furthermore, the stress of the OLED element can be reduced, and the decrease in the life of the OLED element can be suppressed.

Control According to Saturation

In the OLED display device, a plurality of pixels is two-dimensionally arranged in a display area of the OLED display panel. Each pixel includes four sub-pixels of the sub-pixel R that generates red (R) light, the sub-pixel G that generates green (G) light, the sub-pixel B that generates blue (B) light, and the sub-pixel W that generates white (W) light. In other words, in the display area of the OLED display panel, the two-dimensionally arrayed pixels are RGBW pixels.

Here, the configuration of each pixel in the display area of the OLED display panel is the RGBW pixel. When the pixels are lit at 100% level, the sub-pixel R, the sub-pixel G, and the sub-pixel B have lower luminous efficiency and a larger current than the sub-pixel W because color filters corresponding to wavelength bands of the respective colors are passed through. Therefore, an upper limit value of the gain of the sub-pixel R, the sub-pixel G, and the sub-pixel B is lower than that of the gain of the sub-pixel W.

In addition, since complementary colors such as yellow (Y), magenta (M), and cyan (C) light two colors of sub-pixels in each pixel, if the pixels are lit at the maximum level as they are, a current limit value will be exceeded.

Therefore, it is necessary to reduce the luminance level of the entire display area of the OLED display panel to keep the luminance level within the current limit value. This current limit value depends on a temperature rise of the panel due to self-heating of the OLED element and a restriction on current capacity of a power supply.

Note that, in each pixel, the color becomes yellow (Y) when the sub-pixel R and the sub-pixel G are lit, the color becomes magenta (M) when the sub-pixel R and the sub-pixel B are lit, and the color becomes cyan (C) when the sub-pixel G and the sub-pixel B are lit.

Figure 8:
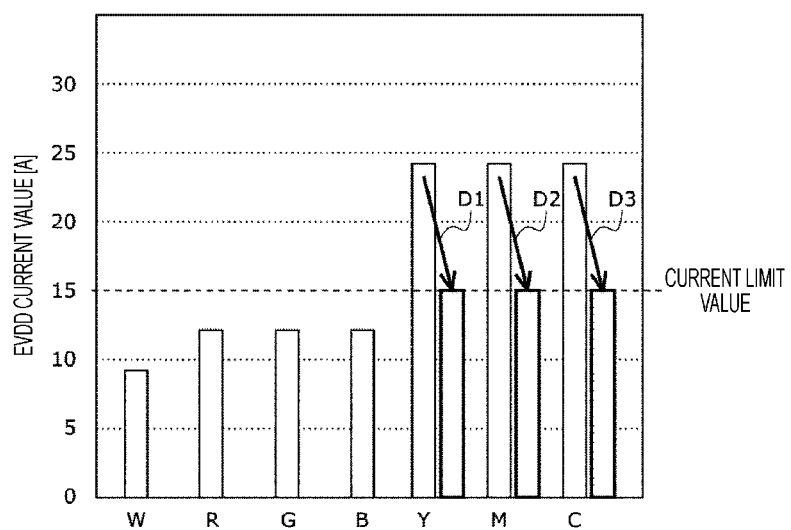
FIG. 8 is a graph illustrating an example of comparison of drive currents in OLED elements at the time of displaying colors.

FIG. 8 illustrates an example of comparison of drive currents in the OLED elements at the time of displaying the respective colors. In FIG. 8, the horizontal axis represents the colors of the sub-pixels (W, R, G, and B) and the colors (Y, M, and C) when the two sub-pixels are lit, and the vertical axis represents EVDD current values. The EVDD current represents a total current flowing through the OLED elements in the entire display area of the OLED display panel.

As illustrated in FIG. 8, since the sub-pixel R, the sub-pixel G, and the sub-pixel B have a higher EVDD current value than the sub-pixel W, the upper limit value of the gain is lower. Furthermore, the complementary colors such as yellow (Y), magenta (M), and cyan (C) exceed the current limit value illustrated by the broken line in the figure when the pixels are lit at the maximum level. Therefore, as illustrated by the thick lines D1 to D3 in the figure, the luminance level of the entire display area of the OLED display panel is lowered to keep the current values within the current limit value.

Here, the luminance of the sub-pixel W during the black insertion drive for performing luminance compensation can be matched with the luminance during drive without black insertion. Note that, at this time, the luminance level is the luminance of the input level of 100%, and the luminance levels of the sub-pixels R, G, and B during the drive without black insertion are, for convenience, the same as the luminance of the sub-pixel W.

For example, in the case of Duty50% during black insertion drive, the luminance compensation is possible for the sub-pixel W by doubling the gain, whereas the sub-pixels R, G, and B have the upper limit value for the gain, the luminance level is lowered by reducing the light emission duty in an area where the average pixel level (APL) is low in the display area.

Figure 9:
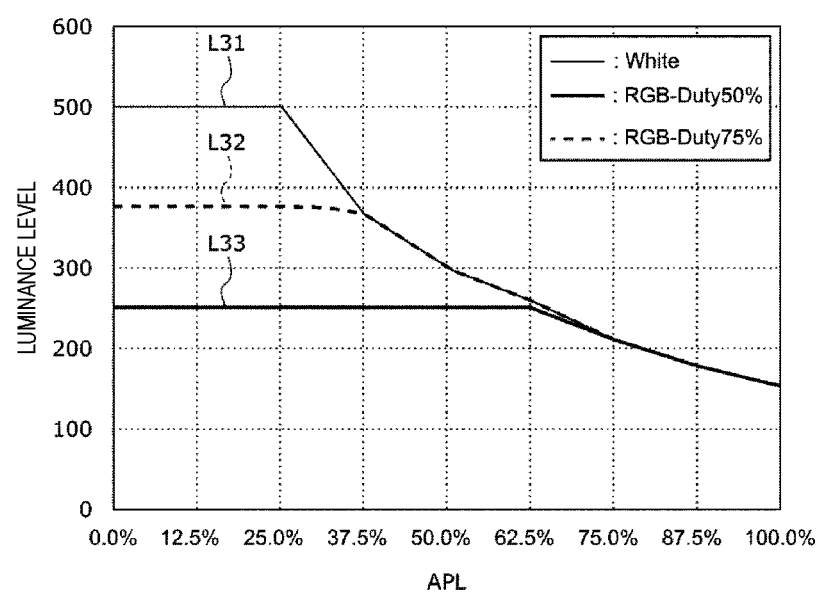
FIG. 9 is a graph illustrating an example of peak luminance control.

FIG. 9 illustrates an example of peak luminance control during black insertion drive for performing luminance compensation. In FIG. 9, the horizontal axis represents the average pixel level (APL) and the vertical axis represents the luminance level.

In FIG. 9, the polygonal line L31 represents control of peak luminance of the sub-pixel W. Furthermore, the polygonal lines L32 and L33 represent control of peak luminance of the sub-pixels R, G, and B.

As illustrated in FIG. 9, since the sub-pixels R, G, and B have the upper limit for the gain, the luminance level can be prevented from being lowered by setting the light emission duty to 75% (Duty75%) in the area where the average pixel level is low. Note that, in the area where average pixel level is high, the luminance levels are almost the same between the light emission duty is 50% (Duty50%) and 75% (Duty75%).

In this way, the sub-pixels R, G, and B have the restriction that the upper limit value of the gain is lower than that of the sub-pixel W. Therefore, a highly saturated pixel has a problem that even if the light emission duty is reduced, the gain cannot be sufficiently raised in order to maintain the saturation, and the luminance is lowered. Therefore, in the present technology, to maintain the luminance balance between pixels with low saturation and pixels with high saturation, the lower limit value of the light emission duty is set according to the saturation level parameter.

Specifically, in the signal processing device 10, the optimum duty value calculation unit 105 calculates an optimum light emission duty value using the saturation level detected by the saturation detection unit 102, so that the luminance balance between the part with high saturation and the part with low saturation is maintained.

Figure 10:
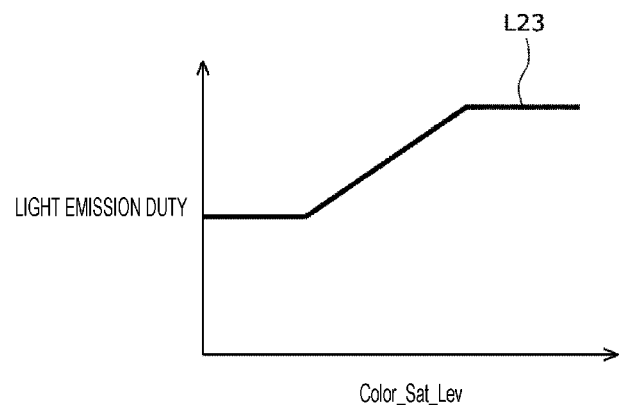
FIG. 10 is a graph illustrating an example of control of light emission duty according to a saturation level.

FIG. 10 illustrates an example of control of the light emission duty according to the saturation level. In FIG. 10, the horizontal axis illustrates the saturation level (Color_S-at_Lev) and the vertical axis represents the light emission duty value.

FIG. 10 illustrates that the saturation becomes higher as the value on the horizontal axis goes rightward, and the light emission duty value becomes higher as the value on the vertical axis goes upward. If the light emission duty is reduced in a video having many areas with high saturation, the luminance balance will be lost due to the upper limit restriction on the gain of the sub-pixels R, G, and B. Therefore, as illustrated by the polygonal line L23, the lower limit value of the light emission duty is set according to the saturation level, and in a video having many areas with high saturation, control to raise the light emission duty is performed, so that the luminance balance between the pixels with high saturation and the pixels with low saturation is maintained.

Control According to APL

In the OLED display panel, the time required from applying a voltage to both ends of the OLED element until a light emission amount reaches a predetermined amount has greater influence on a drive duty as a gradation level becomes lower.

Therefore, when the OLED display device performs black insertion drive as a measure against hold blur, an effective light emission period in a low gradation area decreases and black clipping tends to occur as the light emission duty is reduced. The black clipping is a state in which the difference in luminance of a dark part cannot be sufficiently expressed and is filled like a solid black color.

Figure 11:
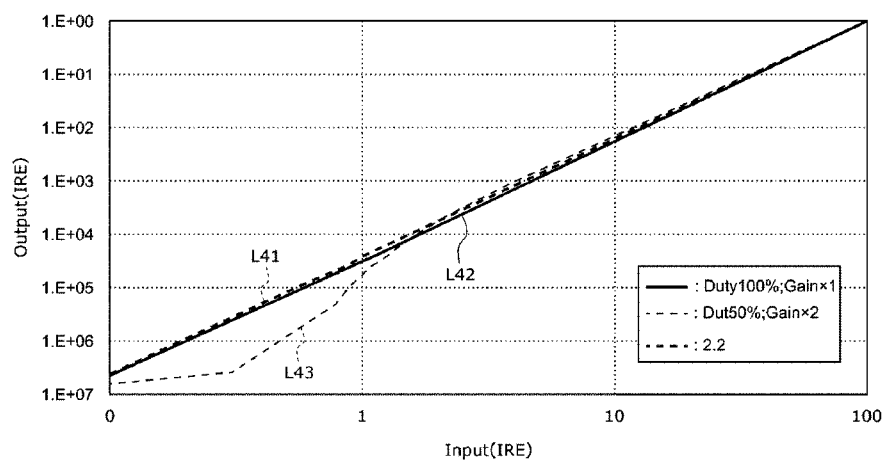
FIG. 11 is a graph illustrating an example of gamma characteristics during black insertion drive.

FIG. 11 illustrates an example of gamma characteristics during black insertion drive. In FIG. 11, the horizontal axis represents an input level and the vertical axis represents an output level.

In FIG. 11, the straight line L41 illustrates a target gamma value (2.2). The polygonal line L42 illustrates the normal drive in which the light emission duty is 100% (Duty100%) and the gain is 1 time (Gain×1). The polygonal line L43 illustrates the black insertion drive in which the light emission duty is 50% (Duty50%) and the gain is doubled (Gain×2).

Focusing on the relationship between the straight line L41 and the polygonal lines L42 and L43 in the lower left area of FIG. 11, it is clear that the lower gradation level has greater influence on the drive duty due to rising characteristics of light emission in the case of driving the OLED element.

Figure 12:
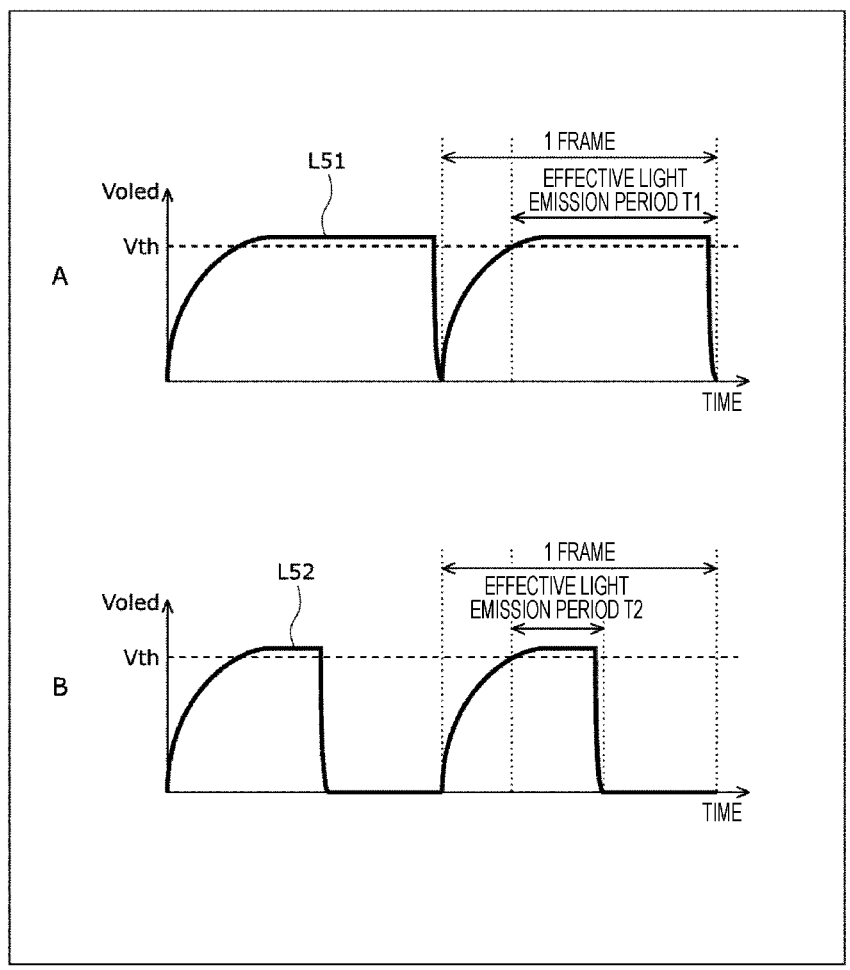
FIGS. 12A and 12B are graphs illustrating an example of an effective light emission period during normal drive and black insertion drive.

FIGS. 12A and 12B illustrates an example of the effective light emission period during normal drive and black insertion drive. In FIGS. 12A and 12B, the horizontal axis represents time and the vertical axis represents a voltage level.

FIG. 12A illustrates voltage fluctuation of the OLED element during normal drive, and the time after a voltage level illustrated by the waveform L51 exceeds a threshold voltage Vth for each frame is an effective light emission period T1. FIG. 12B illustrates voltage fluctuation of the OLED element during black insertion drive, and the time after the voltage level illustrated by the waveform L52 exceeds the threshold voltage Vth for each frame is an effective light emission period T2. The effective light emission period T2 during black insertion drive is shorter than the effective light emission period T1 during normal drive.

In this way, in the case where the OLED element is driven with black insertion, the lower gradation level has greater influence on the drive duty due to the rising characteristics of light emission. Therefore, when the black insertion drive is performed as a measure against hold blur, the effective light emission period decreases and the reduction in luminance becomes significant in the low gradation area, and the black clipping tends to occur, as the light emission duty is reduced.

Therefore, in the present technology, in the case of an image frame with a low average pixel level (APL) (a video in which the entire screen is dark), the lower limit value of the light emission duty is controlled according to the average pixel level parameter, focusing on the fact that the effect of improving hold blur cannot be got, so that deviation of gamma characteristics is suppressed and the black clipping at a low gradation level is suppressed.

Specifically, in the signal processing device 10, the optimum duty value calculation unit 105 calculates an optimum light emission duty value using the average pixel level (APL) detected by the APL detection unit 104, so that the decrease in luminance at a lower gradation level is suppressed.

Figure 13:
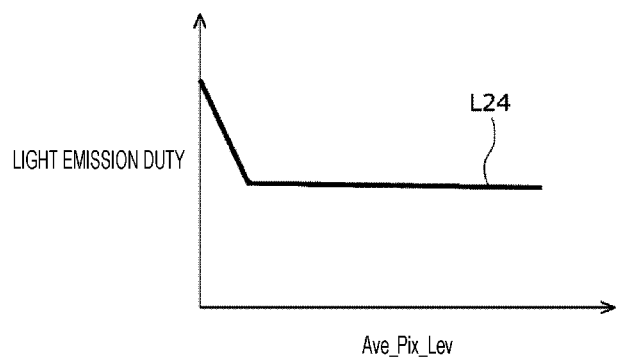
FIG. 13 is a graph illustrating an example of control of light emission duty according to an average pixel level.

FIG. 13 illustrates an example of control of the light emission duty according to the average pixel level (APL). In FIG. 13, the horizontal axis represents the average pixel level (Ave_Pix_Lev), and the vertical axis represents the light emission duty value.

FIG. 13 illustrates that a video is brighter and has a higher average pixel level as the value on the horizontal axis goes rightward, and the light emission duty value becomes higher as the value on the vertical axis goes upward. In a dark video with a low average pixel level, if the light emission duty is reduced, black clipping tends to occur. Therefore, as illustrated by the polygonal line L24, the lower limit value of the light emission duty is set according to the average pixel level, and when the average pixel level is low, control to raise the light emission duty is performed, and the light emission duty value is raised as the average pixel level decreases, so that black clipping at a lower gradation level is suppressed.

Offset Control

In the above description, control of the light emission duty according to the average pixel level (APL) has been described as a measure against the decrease in luminance at a low gradation level in the case where the OLED element is driven with black insertion. However, other methods may be used.

For example, in the signal processing device 10, the offset calculation unit 108 calculates the offset value related to the luminance of the video signal on the basis of the light emission duty value calculated by the optimum duty value calculation unit 105 and adds the offset value to the video signal, so that the luminance is corrected.

By controlling the offset value of the video signal according to the light emission duty value in this way, the decrease in luminance at a low gradation level is suppressed, and black clipping can be suppressed, accordingly. Note that, here, it can also be considered that the gamma characteristics are corrected by correcting the luminance by the offset value.

Peak Current Control

Since the OLED display panel is configured by arranging a plurality of OLED elements in a two-dimensional manner, a scan for black signal is required to turn off each OLED element. In the case of performing black insertion drive, a light emission area changes within one frame, and the current fluctuates.

Therefore, in the case of a display in which a load is concentrated at certain scan timing, there is a problem that a peak current increases by the amount of an average current×the gain and exceeds a peak current limit value of the power supply circuit for driving the OLED element.

Figure 14:
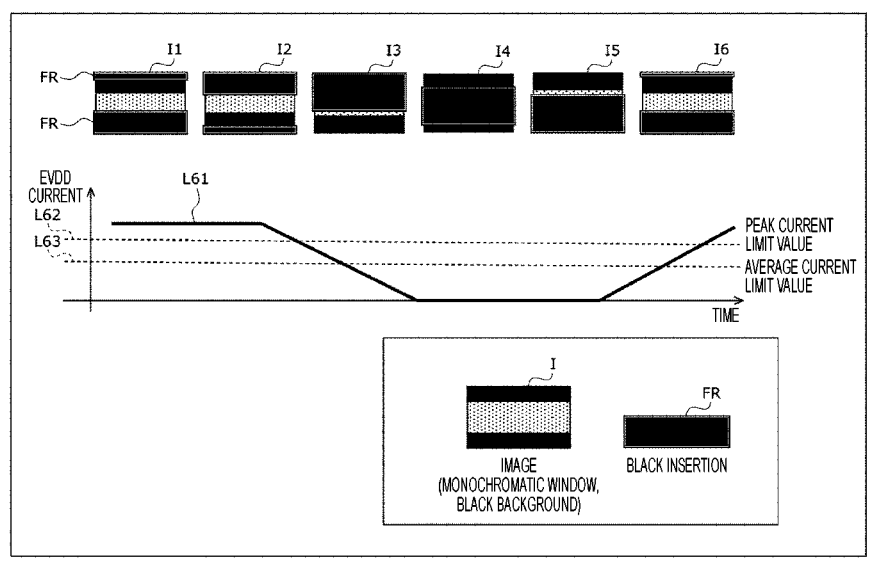
FIG. 14 is a diagram illustrating an example of current fluctuation of a power supply circuit for driving an OLED element.

FIG. 14 illustrates an example of current fluctuation of a power supply circuit for driving an OLED element. In FIG. 14, the horizontal axis represents time and the vertical axis represents the EVDD current value.

In FIG. 14, the polygonal line L61 illustrates temporal fluctuation of the EVDD current value. Furthermore, in FIG. 14, images I1 to I6 in one frame are arranged in chronological order, and correspond to the temporal fluctuation of the EVDD current value illustrated by the polygonal line L61.

Note that the straight line L62 illustrates the peak current limit value, and is controlled such that the peak current does not exceed this limit value. Furthermore, the straight line L63 illustrates an average current limit value, and is controlled such that the average current does not exceed this limit value.

The image I is an image including a monochromatic window represented by a dot pattern and a black background. In the case of performing black insertion drive, a light emission area corresponding to the monochromatic window in the image I changes as in the images I1 to I6 within one image frame. At this time, the EVDD current value illustrated by the polygonal line L61 fluctuates corresponding to this light emission area.

Furthermore, in FIG. 14, the frame FR on the image I represents an area in which the black signal for black insertion is displayed in the frame. As represented by the images I1 to I6, the black insertion is performed from the upper side to the lower side, so that the scan proceeds downward and the displayed signal is updated from the upper side. That is, the black insertion area in the frame FR moves downward.

Here, when the light emission area represented by the horizontal band of the dot pattern has a certain height, such as the images I1, I2, I6 in one frame, that is, in the case of the display in which a load is concentrated at certain scan timing, the peak current increases by the amount of the average current×the gain, so that the EVDD current value illustrated by the broken line L61 exceeds the peak current limit value.

Note that, in a case where no light emission area is present such as the image I4 in one frame, the EVDD current value is set to approximately 0.

In this way, even in the case of performing black insertion drive, the average current of one frame can be set to the same value as the case of not performing black insertion drive, but since the light emitting area changes within one frame, the current fluctuation occurs, and there is a problem that the current needs to be suppressed within the peak current value that the drive power supply circuit can tolerate. Therefore, in the present technology, the method of calculating the current limit is corrected according to the gain for luminance compensation, and the control is performed so that the peak current becomes a certain value or less.

That is, in the present technology, the calculated value of the peak current is corrected according to the gain, and control to reduce the average current limit value can be performed according to the ratio of the gain exceeding the peak current limit value so that the peak current does not exceed the peak current limit value even in the case where the peak current in which the load is concentrated is the maximum.

Specifically, in the signal processing device 10, the peak current control unit 107 controls the peak current on the basis of the gain calculated by the gain calculation unit 106, thereby suppressing the peak current within the peak current limit value of the drive power supply circuit.

Figure 15:
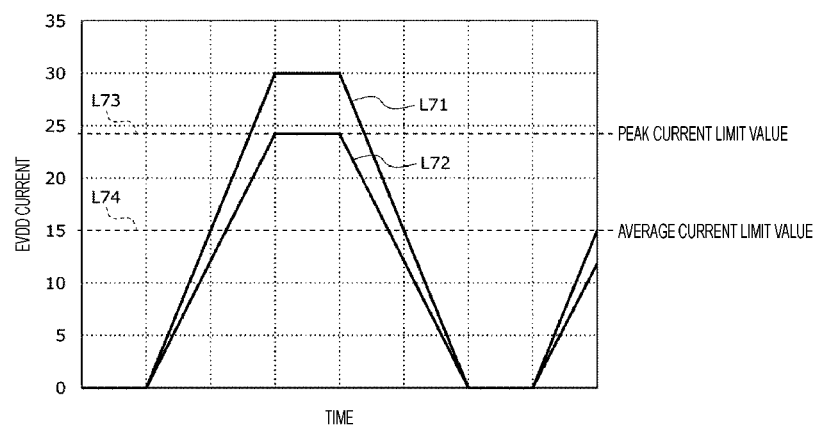
FIG. 15 is a graph illustrating an example of peak current control.

FIG. 15 illustrates an example of peak current control. In FIG. 15, the horizontal axis represents time and the vertical axis represents the EVDD current value.

In FIG. 15, the polygonal line L71 illustrates the temporal fluctuation of the EVDD current value in the case of not performing the peak current control. The polygonal line L72 illustrates the temporal fluctuation of the EVDD current value in the case of performing the peak current control. Note that the straight line L73 illustrates the peak current limit value. Furthermore, the straight line L74 illustrates the average current limit value.

Here, the limits regarding the current value in the drive power supply circuit include the limit on the average current value and the limit on the peak current value. In a case of not limiting the peak current, the peak current value increases by a maximum of 1/Duty (for example, in the case of Duty50%, the increase is up to double), and the peak current exceeds the peak current limit value.

To keep the peak current within the peak current limit value, control to reduce the gain of the entire display area is necessary. In the example illustrated in FIG. 15, the gain to be raised by the luminance compensation during black insertion drive is controlled to a value as expressed by the following equation (1).

The gain=the peak current limit value/the average current limit value (1)

In this way, in the case of not controlling the peak current, the peak current has exceeded the peak current limit value L73, as illustrated by the polygonal line L71, but by controlling the peak current, the peak current is controlled to fall within the peak current limit value L73, as illustrated by the polygonal line L72. Thereby, the reliability of the drive power supply circuit can be ensured.

Configuration of Self-luminous Display Device

Figure 16:
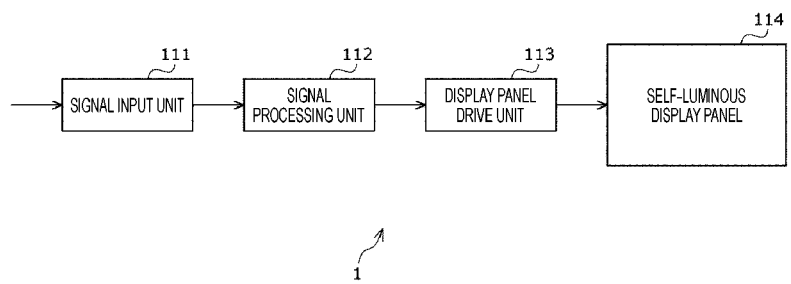
FIG. 16 is a block diagram illustrating an example of a configuration of an embodiment of a self-luminous display device to which the present technology is applied.

FIG. 16 illustrates an example of a configuration of an embodiment of a self-luminous display device to which the present technology is applied.

In FIG. 16, a self-luminous display device 1 is configured as a television receiver or the like. The self-luminous display device 1 includes a signal input unit 111, a signal processing unit 112, a display panel drive unit 113, and a self-luminous display panel 114. Note that the signal processing unit 112 corresponds to the signal processing device 10 of FIG. 1, and the display panel drive unit 113 corresponds to the panel driver 20 of FIG. 1.

The signal input unit 111 includes a tuner connected to an antenna, a communication module connectable to a communication network such as the Internet, an input interface conforming to a predetermined standard, and the like.

The signal input unit 111 supplies, to the signal processing unit 112, video signals of various types of content such as broadcast content transmitted by terrestrial broadcasting, satellite broadcasting, or the like, communication content streamed via a communication network such as the Internet, and recorded content recorded on a recording medium such as an optical disk or semiconductor memory, or a recorder.

The signal processing unit 112 performs predetermined video signal processing on the basis of the video signal of the content supplied from the signal input unit 111. In this video signal processing, the video signal and the control signal for controlling the drive of the self-luminous display panel 114 are generated and supplied to the display panel drive unit 113. For example, the control signal includes the parameters such as the light emission duty value (Duty), the gain (Gain), the current limit value (Cur_ratio), and the offset value (offset).

The display panel drive unit 113 drives the self-luminous display panel 114 on the basis of the video signal and the control signal supplied from the signal processing unit 112. The self-luminous display panel 114 is a display panel in which pixels including self-luminous elements are arranged in a two-dimensional manner, and displays a video according to the drive from the display panel drive unit 113.

As the self-luminous display panel 114, an OLED display panel using the OLED elements as the self-luminous elements can be adopted. In the case of adopting the OLED display panel as the self-luminous display panel 114, the self-luminous display device 1 is an OLED display device.

Note that, in the configuration illustrated in FIG. 16, the minimum configuration is illustrated for the sake of simplification of description, but other circuits and devices such as an audio signal processing circuit that processes an audio signal and a speaker that outputs audio according to the audio signal may also be included.

2. Modification

In the signal processing device 10, when the optimum duty value calculation unit 105 calculates the light emission duty value, not only one of the four parameters (Detail_Lev, Color_Sat_Lev, Motion, and Ave_Pix_Lev) but also a plurality of the parameters may be used to calculate the light emission duty value. Furthermore, in the signal processing device 10, the above-described plurality of controls, for example, the current control by the peak current control unit 107 and the offset value control by the offset calculation unit 108 may be performed at the same time.

In the above description, the case where the self-luminous display device 1 is a television receiver has been illustrated, but examples of electronic devices using the self-luminous display device 1 include a display device, a personal computer, and a tablet computer, a smartphone, a mobile phone, a digital camera, a head mount display, and a game machine.

Moreover, the self-luminous display device 1 may be used as a display unit for an in-vehicle device such as a car navigation system or a rear seat monitor, or for a wearable device such as a wristwatch type or an eyeglass type. Note that examples of display devices include a medical monitor, a broadcasting monitor, and a display for digital signage.

Note that, in the present specification, "OLED" may be read as "organic EL". For example, the OLED display device can be said to be an organic EL display device. Furthermore, since the hold blur is also referred to as motion blur, the "hold blur" may be read as "motion blur". Moreover, since the video includes a plurality of image frames, the "video" may be read as "image".

Note that embodiments of the present technology are not limited to the above-described embodiments, and various modifications can be made without departing from the gist of the present technology.

Furthermore, the effects described in the present specification are merely examples and are not limited, and other effects may be exhibited.

Note that the present technology can employ the following configurations.

(1)

A signal processing device including:

a detection unit configured to analyze a video signal of content and detect an index that correlates with hold blur;

a first calculation unit configured to calculate a light emission duty value of a self-luminous display panel on the basis of the detected index; and a second calculation unit configured to calculate a gain for luminance compensation on the basis of the calculated light emission duty value.

(2)

The signal processing device according to (1), in which the detection unit detects a motion amount of an object displayed on the self-luminous display panel, and the first calculation unit calculates the light emission duty value according to the detected motion amount.

(3)

The signal processing device according to (2), in which the first calculation unit reduces the light emission duty value as the detected motion amount increases, and the second calculation unit raises the gain in response to a change in the light emission duty value.

(4)

The signal processing device according to any one of (1) to (3), in which the detection unit detects a detail level of a video displayed on the self-luminous display panel, and the first calculation unit calculates the light emission duty value according to the detected detail level.

(5)

The signal processing device according to (4), in which the first calculation unit reduces the light emission duty value as the detected detail level increases, and the second calculation unit raises the gain in response to a change in the light emission duty value.

(6)

The signal processing device according to any one of (1) to (5), in which the detection unit detects a saturation level of a video displayed on the self-luminous display panel, and the first calculation unit calculates the light emission duty value according to the detected saturation level.

(7)
The signal processing device according to (6), in which the first calculation unit sets a limit on a lower limit value of the light emission duty value according to the detected saturation level.

(8)
The signal processing device according to any one of (1) to (7), in which
the detection unit detects an average pixel level of the video signal, and
the first calculation unit calculates the light emission duty value according to the detected average pixel level.

(9)
The signal processing device according to (8), in which, in a case where the detected average pixel level is less than a certain level, the first calculation unit sets a limit on a lower limit value of the light emission duty value, and raises the light emission duty value as the average pixel level decreases.

(10)
The signal processing device according to any one of (1) to (9), further including:
a control unit configured to control a current flowing through a self-luminous element arranged in the self-luminous display panel so as to be suppressed within an allowable peak current by a power supply circuit according to the gain.

(11)
The signal processing device according to (10), in which the control unit controls the peak current not to exceed a peak current limit value in a case where the peak current becomes maximum when a light emission area of the self-luminous display panel varies within one frame of the video and current fluctuation occurs.

(12)
The signal processing device according to (11), in which the control unit performs control such that the gain becomes a value obtained by dividing the peak current limit value by an average current limit value.

(13)
The signal processing device according to any one of (1) to (12), further including:
a third calculation unit configured to calculate an offset value regarding luminance of the video signal according to the light emission duty value.

(14)
The signal processing device according to (13), in which a decrease in the luminance at a low gradation level is corrected by the offset value.

(15)
The signal processing device according to any one of (1) to (14), in which
a light emission duty is reduced by black insertion drive provided with a black display period during a display period for displaying the same video.

(16)
The signal processing device according to (15), in which the gain is obtained by a reciprocal of the light emission duty value.

(17)
The signal processing device according to any one of (1) to (16), in which
the self-luminous display panel has a first sub-pixel that generates red (R) light, a second sub-pixel that generates green (G) light, a third sub-pixel that generates blue (B) light, and a fourth sub-pixel that generates white (W) light arranged in a two-dimensional manner.

(18)
The signal processing device according to (17), in which the pixel includes an organic light emitting diode (OLED) element as a self-luminous element.

(19)
A signal processing method including:
by a signal processing device,
analyzing a video signal of content and detecting an index that correlates with hold blur;
calculating a light emission duty value of a self-luminous display panel on the basis of the detected index; and
calculating a gain for luminance compensation on the basis of the calculated light emission duty value.

(20)
A display device including:
a signal processing unit configured to process a video signal of content;
a self-luminous display panel configured to display a video of the content; and
a display panel drive unit configured to drive the self-luminous display panel on the basis of the video signal from the signal processing unit, in which
the signal processing unit includes
a detection unit configured to analyze the video signal of content and detect an index that correlates with hold blur,
a first calculation unit configured to calculate a light emission duty value of the self-luminous display panel on the basis of the detected index, and
a second calculation unit configured to calculate a gain for luminance compensation on the basis of the calculated light emission duty value, and
the display panel drive unit drives the self-luminous display panel on the basis of the light emission duty value and the gain calculated by the signal processing unit.

REFERENCE SIGNS LIST

1 Self-luminous display device
10 Signal processing device
20 Panel driver
30 Signal line
40 Control line
100 Detection unit
101 Image flatness detection unit
102 Saturation detection unit
103 Motion detection unit
104 APL detection unit
105 Optimum duty value calculation unit
106 Gain calculation unit
107 Peak current control unit
108 Offset calculation unit
111 Signal input unit
112 Signal processing unit
113 Display panel drive unit
114 Self-luminous display panel

The invention claimed is:
1. A signal processing device, comprising:
signal processing circuitry configured to analyze spatial resolution of a plurality of frames of a video signal of content and detect an index that correlates with hold blur, wherein
the detected index represents an edge part included in the video signal, and
the detected index is based on the analysis of the spatial resolution of the plurality of frames included in the video signal;

calculate, based on the detected index, a light emission duty value of a self-luminous display panel that includes a plurality of pixels that each includes a group of subpixels, wherein the calculated light emission duty value for a black insertion drive is lower than the calculated light emission duty value for a normal drive, and in the black insertion drive, display time of a video is shortened by a black display period during a display period of the video and peak luminance of the brightest subpixel within one of the plurality of pixels exceeds combined peak luminance of the remaining subpixels within the one of the plurality of pixels at a lower portion of an average pixel level of the video signal when the calculated light emission duty value is less than 100%; and calculate, based on the calculated light emission duty value, a gain for luminance compensation, wherein the calculated gain for the black insertion drive is greater than the calculated gain for the normal drive.

2. The signal processing device according to claim 1, wherein the signal processing circuitry is further configured to;

detect a motion amount of an object displayed on the self-luminous display panel, and calculate the light emission duty value based on the detected motion amount.

3. The signal processing device according to claim 2, wherein the signal processing circuitry is further configured to:

reduce the light emission duty value as the detected motion amount increases, and raise the gain in response to the reduction in the light emission duty value.

4. The signal processing device according to claim 1, wherein the signal processing circuitry is further configured to:

detect a detail level of the video displayed on the self-luminous display panel, and calculate the light emission duty value based on the detected detail level.

5. The signal processing device according to claim 4, wherein the signal processing circuitry is further configured to:

reduce the light emission duty value as the detected detail level increases, and raise the gain in response to the reduction in the light emission duty value.

6. The signal processing device according to claim 1, wherein the signal processing circuitry is further configured to:

detect a saturation level of the video displayed on the self-luminous display panel, and calculate the light emission duty value based on the detected saturation level.

7. The signal processing device according to claim 6, wherein the signal processing circuitry is further configured to set a limit on a lower limit value of the light emission duty value based on the detected saturation level.

8. The signal processing device according to claim 1, wherein the signal processing circuitry is further configured to:

detect the average pixel level of the video signal, and calculate the light emission duty value based on the detected average pixel level.

9. The signal processing device according to claim 8, wherein, in a case where the detected average pixel level is less than a specific level, the signal processing circuitry is further configured to:

set a limit on a lower limit value of the light emission duty value, and raise the light emission duty value as the average pixel level decreases.

10. The signal processing device according to claim 1, the signal processing circuitry configured to control a current flow through a self-luminous element in the self-luminous display panel so as to suppress, based on the calculated gain, a peak current within an allowable peak current value of a power supply circuit.

11. The signal processing device according to claim 10, wherein the signal processing circuitry is further configured to control the peak current not to exceed a peak current limit value in a case where the peak current becomes maximum when a light emission area of the self-luminous display panel varies within one frame of the video and fluctuation of current occurs.

12. The signal processing device according to claim 11, wherein the signal processing circuitry is further configured to control such that the gain becomes a value obtained by division of the peak current limit value by an average current limit value.

13. The signal processing device according to claim 1, wherein the signal processing circuitry configured to calculate, based on the calculated light emission duty value, an offset value regarding luminance of the video signal.

14. The signal processing device according to claim 13, wherein the signal processing circuitry is further configured to decrease, based on the calculated offset value, the luminance at a low gradation level.

15. The signal processing device according to claim 1, wherein the signal processing circuitry is further configured to calculate the gain as a reciprocal of the light emission duty value.

16. The signal processing device according to claim 1, wherein the group of subpixels includes a first sub-pixel that generates red (R) light, a second sub-pixel that generates green (G) light, a third sub-pixel that generates blue (B) light, and a fourth sub-pixel that generates white (W) light, and arrangement of the plurality of pixels is in a two-dimensional manner.

17. The signal processing device according to claim 16, wherein each pixel of the plurality of pixels includes an organic light emitting diode (OLED) element as a self-luminous element.

18. A signal processing method, comprising:

in a signal processing circuitry, analyzing spatial resolution of a plurality of frames of a video signal of content and detecting an index that correlates with hold blur, wherein the detected index represents an edge part included in the video signal, and the detected index is based on the analysis of the spatial resolution of the plurality of frames included in the video signal;
calculating, based on the detected index, a light emission duty value of a self-luminous display panel that includes a plurality of pixels that each includes a group of subpixels, wherein
the calculated light emission duty value for a black insertion drive is lower than the calculated light emission duty value for a normal drive, and
in the black insertion drive, display time of a video is shortened by a black display period during a display period of the video and peak luminance of the brightest subpixel within one of the plurality of pixels exceeds combined peak luminance of the remaining subpixels within the one of the plurality of pixels at a lower portion of an average pixel level of the video signal when the calculated light emission duty value is less than 100%; and
calculating, based on the calculated light emission duty value, a gain for luminance compensation, wherein the calculated gain for the black insertion drive is greater than the calculated gain for the normal drive.

19. The signal processing method according to claim 18, wherein in the black insertion drive, when the display time of a video is shortened by the black display period during a display period of the video, the combined peak luminance of the remaining subpixels within the one of the plurality of pixels at a higher portion of the average pixel level of the video signal is the same as peak luminance of the brightest subpixel.

20. A display device, comprising:
a signal processing circuitry configured to process a video signal of content;
a self-luminous display panel configured to display a video of the content; and
a display panel drive circuitry configured to drive the self-luminous display panel based on the video signal from the signal processing unit, wherein the signal processing circuitry includes:
a detection circuitry configured to analyze spatial resolution of a plurality of frames of the video signal of the content and detect an index that correlates with hold blur, wherein
the detected index represents an edge part included in the video signal, and
the detected index is based on the analysis of the spatial resolution of the plurality of frames included in the video signal;
a first calculation circuitry configured to calculate, based on the detected index,
a light emission duty value of the self-luminous display panel that includes a plurality of pixels that each includes a group of subpixels, wherein
the calculated light emission duty value for a black insertion drive is lower than the calculated light emission duty value for a normal drive, and
in the black insertion drive, display time of the video is shortened by a black display period during a display period of the video and peak luminance of the brightest subpixel within one of the plurality of pixels exceeds combined peak luminance of the remaining subpixels within the one of the plurality of pixels at a lower portion of the average pixel level of the video signal when the light emission duty value is less than 100%, and
a second calculation circuitry configured to calculate, based on the calculated light emission duty value, a gain for luminance compensation, wherein the calculated gain for the black insertion drive is greater than the calculated gain for the normal drive, and
the display panel drive circuitry is configured to drive the self-luminous display panel based on the calculated light emission duty value and the calculated gain.

* * * * *